United States Patent
Kodato

(10) Patent No.: US 7,952,383 B2
(45) Date of Patent: May 31, 2011

(54) SEMICONDUCTOR DEVICE INCLUDING OUTPUT BUFFER AND CONTROL CIRCUIT ADJUSTING AN IMPEDANCE OF THE OUTPUT BUFFER

(75) Inventor: Masaru Kodato, Tokyo (JP)

(73) Assignee: Elpida Memory, Inc., Chuo-ku, Tokyo (JP)

( * ) Notice: Subject to any disclaimer, the term of this patent is extended or adjusted under 35 U.S.C. 154(b) by 0 days.

(21) Appl. No.: 12/461,724

(22) Filed: Aug. 21, 2009

(65) Prior Publication Data

US 2010/0045338 A1     Feb. 25, 2010

(30) Foreign Application Priority Data

Aug. 23, 2008   (JP) ................. 2008-214738

(51) Int. Cl.
*H03K 19/003* (2006.01)
(52) U.S. Cl. .................. 326/30; 326/29; 327/170
(58) Field of Classification Search .......... 326/30, 326/21, 26–27, 29; 327/170
See application file for complete search history.

(56) References Cited

U.S. PATENT DOCUMENTS

| | | | | |
|---|---|---|---|---|
| 5,254,883 A | * | 10/1993 | Horowitz et al. | 326/30 |
| 5,898,321 A | * | 4/1999 | Ilkbahar et al. | 326/87 |
| 6,288,563 B1 | * | 9/2001 | Muljono et al. | 326/27 |
| 6,384,621 B1 | * | 5/2002 | Gibbs et al. | 326/30 |
| 7,038,486 B2 | * | 5/2006 | Aoyama et al. | 326/30 |

FOREIGN PATENT DOCUMENTS

| | | |
|---|---|---|
| JP | 7-86900 | 3/1995 |
| JP | 8-97693 | 4/1996 |

* cited by examiner

*Primary Examiner* — James Cho
(74) *Attorney, Agent, or Firm* — McGinn IP Law Group, PLLC

(57) ABSTRACT

There is provided a semiconductor device that includes: an output buffer capable of adjusting an impedance based on an impedance adjustment signal, and a through-rate control circuit that adjusts a through rate of the output buffer based on at least the impedance adjustment signal, wherein the through-rate control circuit sets a relatively high through rate when the impedance adjustment signal designates a relatively low impedance, and sets a relatively low through rate when the impedance adjustment signal designates a relatively high impedance.

12 Claims, 15 Drawing Sheets

| ZQP | | | | | THROUGH-RATE |
|---|---|---|---|---|---|
| 5 | 4 | 3 | 2 | 1 | |
| 1 | 1 | 1 | X | X | 3 PITCHES DECREASING |
| 1 | 1 | 0 | X | X | 2 PITCHES DECREASING |
| 1 | 0 | 1 | X | X | 1 PITCH DECREASING |
| 0 | 1 | 0 | X | X | 1 PITCH RISING |
| 0 | 0 | 1 | X | X | 2 PITCHES RISING |
| 0 | 0 | 0 | X | X | 3 PIRCHES RISING |

FIG.10A

| ZQN | | | | | THROUGH-RATE |
|---|---|---|---|---|---|
| 5 | 4 | 3 | 2 | 1 | |
| 1 | 1 | 1 | X | X | 3 PIRCHES RISING |
| 1 | 1 | 0 | X | X | 2 PITCHES RISING |
| 1 | 0 | 1 | X | X | 1 PITCH RISING |
| 0 | 1 | 0 | X | X | 1 PITCH DECREASING |
| 0 | 0 | 1 | X | X | 2 PITCHES DECREASING |
| 0 | 0 | 0 | X | X | 3 PITCHES DECREASING |

FIG.10B

SEMICONDUCTOR DEVICE INCLUDING OUTPUT BUFFER AND CONTROL CIRCUIT ADJUSTING AN IMPEDANCE OF THE OUTPUT BUFFER

BACKGROUND OF THE INVENTION

1. Field of the Invention

The present invention relates to a semiconductor device and a data processing system including the same, and more particularly relates to a semiconductor device capable of adjusting a through rate of an output buffer, and a data processing system including the semiconductor device.

2. Description of Related Art

In semiconductor devices having a high data transfer rate such as a DRAM (Dynamic Random Access Memory), some devices are configured to be capable of changing a through rate of an output buffer at a manufacturing stage. Specifically, a selection circuit to select a through rate of the output buffer is provided in a chip beforehand, and data is written into the selection circuit to obtain an optimum through rate based on a result of an operation test performed in a wafer state. With this arrangement, the through rate of the output buffer is adjusted at the manufacturing stage. A general-purpose DRAM and the like are sometimes configured to select one through rate from among plural through rates prepared according to usage.

However, because the selection of through rate is irreversibly performed by using a fuse element or the like, once a through rate is selected, the through rate cannot be changed thereafter. The through rate obtained in practice dynamically changes depending on a power source voltage, environmental temperature, and secular changes and so on at an actual using time. Therefore, when the through rate is fixed at a manufacturing stage, there is a risk that the through rate is deviated from a design value.

As a method of solving this problem, Japanese Patent Application Laid-open No. H8-97693 discloses a method of measuring a through rate by using a ring oscillator, and setting variable a through rate of an output buffer at an actual using time based on a result of the measurement. Further, Japanese Patent Application Laid-open No. H7-86900 discloses a method of measuring a through rate by using two delay chains having different loads, and setting a through rate of an output buffer variable at an actual using time based on a result of the measurement.

However, the methods disclosed in Japanese Patent Application Laid-open Nos. H8-97693 and H7-86900 have a problem such that not only a chip area is substantially increased but also large power is consumed to measure a through rate, because both methods use exclusive circuits (a ring oscillator and delay chains) to measure a through rate. In addition, because the through rate is adjusted by a result of measurement made by exclusive circuits, changes of characteristics generated in the output buffer are not always reflected, and thus it is difficult to obtain a correct through rate.

SUMMARY OF THE INVENTION

The present invention seeks to solve one or more of the above problems, or to improve upon those problems at least in part.

In one embodiment, there is provided a semiconductor device includes: an output buffer capable of adjusting an impedance based on an impedance adjustment signal, and a through-rate control circuit that adjusts a through rate of the output buffer based on at least the impedance adjustment signal, wherein the through-rate control circuit sets a relatively high through rate when the impedance adjustment signal designates a relatively low impedance, and sets a relatively low through rate when the impedance adjustment signal designates a relatively high impedance.

The phrasing "when the impedance adjustment signal designates a relatively low impedance" means that the actual impedance of the output buffer is higher than a design value and the impedance needs to be decreased to correct this. Therefore, that's not to say that the impedance of the output buffer is adjusted to become lower than the design value. Similarly, the phrasing "when the impedance adjustment signal designates a relatively high impedance" means that the actual impedance of the output buffer is lower than a design value and the impedance needs to be increased to correct this. Therefore, that's not to say that the impedance of the output buffer is adjusted to become higher than the design value.

Reasons that the through rate of the output buffer can be adjusted based on the impedance adjustment signal are as follows. That is, a phenomenon that the actual impedance of the output buffer becomes higher than a design value occurs because the capacity of a transistor constituting the output buffer becomes lower than the design value. In this case, the through rate of the output buffer tends to become lower than the design value. Therefore, in this case, the through rate can be set closer to the design value by increasing the through rate of the output buffer. On the other hand, a phenomenon that the actual impedance of the output buffer becomes lower than a design value occurs because the capacity of a transistor constituting the output buffer becomes higher than the design value. In this case, the through rate of the output buffer tends to become higher than the design value. Therefore, in this case, the through rate can be set closer to the design value by decreasing the through rate of the output buffer.

The impedance adjustment signal can be generated by directly or indirectly measuring the impedance of the output buffer. This measurement can be performed either inside or outside of the semiconductor device. To measure the impedance inside the semiconductor device, it suffices that a so-called calibration circuit is incorporated in the semiconductor device. On the other hand, when the calibration circuit is not present inside the semiconductor device, it suffices that a controller connected to the semiconductor device measures the impedance. That is, the data processing system according to the present invention generates an impedance adjustment signal based on an impedance of an output buffer measured by a controller.

According to the present invention, because a through rate is adjusted by using a signal (an impedance adjustment signal) for adjusting an impedance of an output buffer, an exclusive circuit to measure a through rate is not necessary. Accordingly, the through rate of the output buffer can be dynamically adjusted without substantially increasing a chip area. Further, there is no increase of power consumption due to the exclusive circuit.

Furthermore, because the impedance adjustment signal changes according to a characteristic of the output buffer, adjustment can be performed more accurately by using this signal to adjust the through rate of the output buffer. That is, accurate adjustment can be performed, because a measurement result of the output buffer is reflected to the output buffer instead of reflecting a measurement result of the exclusive circuit to the output buffer.

Therefore, it is very preferable that the present invention is applied to a semiconductor device having a high data transfer rate such as a DRAM.

BRIEF DESCRIPTION OF THE DRAWINGS

The above features and advantages of the present invention will be more apparent from the following description of certain preferred embodiments taken in conjunction with the accompanying drawings, in which:

FIGS. 10A and 10B are tables for explaining examples of a converting operation based on an impedance adjustment signal;

DETAILED DESCRIPTION OF THE EMBODIMENTS

Preferred embodiments of the present invention will be explained below in detail with reference to the accompanying drawings.

Figure 1:
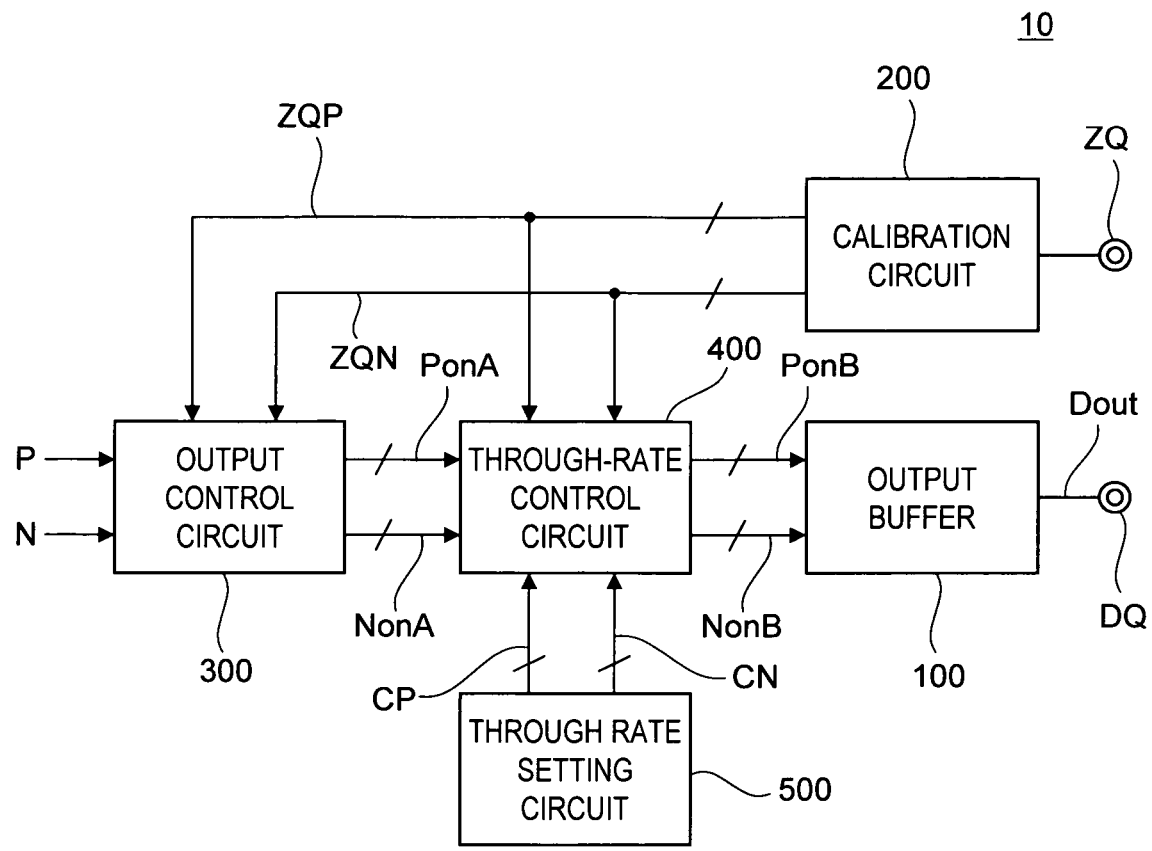
FIG. 1 is a block diagram showing a configuration of a main part of a semiconductor device 10 according to a preferred embodiment of the present invention.

FIG. 1 is a block diagram showing a configuration of a main part of a semiconductor device 10 according to a preferred embodiment of the present invention.

As shown in FIG. 1, the semiconductor device 10 according to the present embodiment has a data output terminal DQ and a calibration terminal ZQ as external terminals. Other external terminals (such as an address terminal, a command terminal, and a clock terminal) are also provided in the semiconductor device 10. Because these terminals are not directly relevant to the scope of the present invention, they will be omitted from the drawings and the following explanations. The data output terminal DQ does not need to be a terminal that only performs output of data, and can be a data input/output terminal that inputs data as well.

An output buffer 100 is connected to the data output terminal DQ. The output buffer 100 outputs high-level or low-level output data Dout from the data output terminal DQ based on ON signals NonB and PonB. In the present embodiment, both the ON signals NonB and PonB are five-bit signals. This is because both a pull-up circuit PU and a pull-down circuit PD included in the output buffer 100 are configured by five output transistors, as described later. When the semiconductor device 10 has an ODT (On Die Termination) function, the output buffer 100 can function as a termination resistor. A specific circuit configuration of the output buffer 100 is described later.

A calibration circuit 200 is connected to the calibration terminal ZQ. While the detail is described later, the calibration circuit 200 includes a replica buffer having a circuit configuration substantially the same as that of the output buffer 100. By performing a calibration operation using the replica buffer, impedance adjustment signals ZQP and ZQN are generated. The impedance adjustment signal ZQP is a signal for adjusting the pull-up circuit included in the output buffer 100, and the impedance adjustment signal ZQN is a signal for adjusting the pull-down circuit. In the present embodiment, both the impedance adjustment signals ZQP and ZQN are five-bit signals.

The impedance adjustment signals ZQP and ZQN are supplied to an output control circuit 300 and a through-rate control circuit 400.

The output control circuit 300 is a circuit that generates ON signals PonA and NonA by receiving data signals P and N from an internal circuit (not shown) and the impedance adjustment signals ZQP and ZQN. The ON signal PonA is a five-bit signal generated based on the data signal P and the impedance adjustment signal ZQP. The ON signal NonA is a five-bit signal generated based on the data signal N and the impedance adjustment signal ZQN. A specific circuit configuration of the output control circuit 300 is described later.

The through-rate control circuit 400 is a circuit that generates the ON signals PonB and NonB by receiving the ON signals PonA and NonA, the impedance adjustment signals ZQP and ZQN, and through-rate setting signals CP and CN. The ON signal PonB is logically an inverting signal of the ON signal PonA, and a waveform of this signal is adjusted by the impedance adjustment signal ZQP and the through-rate setting signal CP. Similarly, the ON signal NonB is logically an inverting signal of the ON signal NonA, and a waveform of this signal is adjusted by the impedance adjustment signal ZQN and the through-rate setting signal CN. A specific circuit configuration of the through-rate control circuit 400 is described later.

The through-rate setting signals CP and CN are three-bit signals that are output respectively from a through rate setting circuit 500. Values of the through-rate setting signals CP and CN are fixed by nonvolatile writing (for example, destruction of a fuse element or an anti-fuse element) to the through rate setting circuit 500 at the manufacturing stage. Writing to the through rate setting circuit 500 at the manufacturing stage is performed based on a result of an operation test performed in a wafer state or based on usage of the semiconductor device 10. Therefore, the through rate set by the through-rate setting signals CP and CN is an optimum value in shipment. Thus, the through rate setting circuit 500 is a circuit that preliminarily sets the through rate of the output buffer 100.

Each circuit constituting the semiconductor device 10 is explained in detail.

Figure 2:
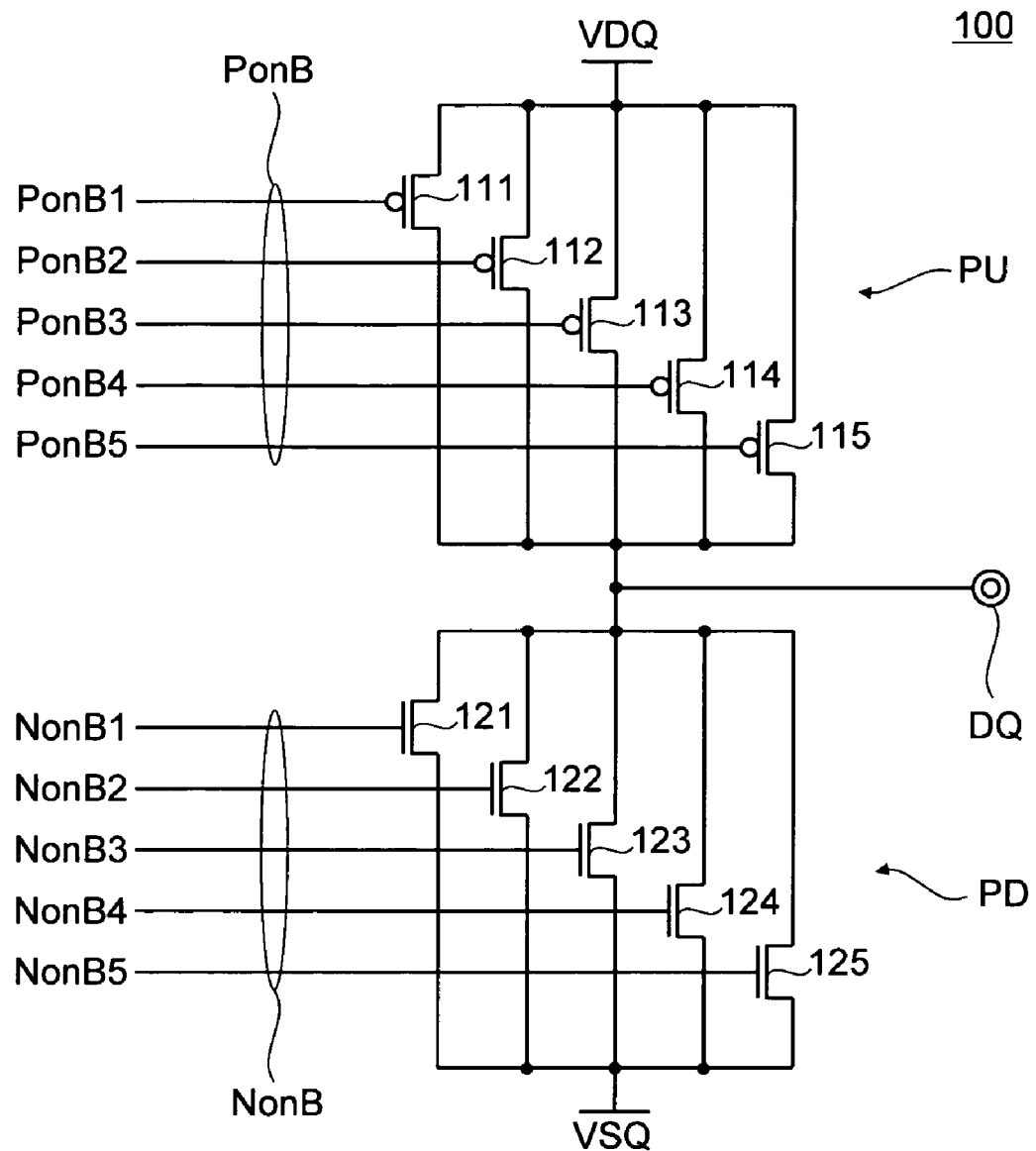
FIG. 2 is a circuit diagram of the output buffer 100.

FIG. 2 is a circuit diagram of the output buffer 100.

As shown in FIG. 2, the output buffer 100 is configured by output transistors 111 to 115 including plural (five in the present embodiment) P-channel MOS transistors connected in parallel between a power source potential VDQ and the data output terminal DQ, and output transistors 121 to 125 including plural (five in the present embodiment) N-channel MOS transistors connected in parallel between the data output terminal DQ and a ground potential VSQ. In the output buffer 100, a parallel circuit including the output transistors 111 to 115 constitutes the pull-up circuit PU, and a parallel circuit including the output transistors 121 to 125 constitutes the pull-down circuit PD.

Five operation signals PonB1 to PonB5 constituting the ON signal PonB are supplied to gates (control electrodes) of the output transistors 111 to 115, respectively. Therefore, the output transistors 111 to 115 constituting the pull-up circuit PU are individually on/off controlled based on the operation signals PonB1 to PonB5. Similarly, five operation signals NonB1 to NonB5 constituting the ON signal NonB are supplied to gates (control electrodes) of the output transistors 121 to 125, respectively. Therefore, the output transistors 121 to 125 constituting the pull-down circuit PD are also individually on/off controlled based on the operation signals NonB1 to NonB5.

The pull-up circuit PU and the pull-down circuit PD constituting the output buffer 100 are designed to become in predetermined impedances during conduction. However, on resistance of a transistor fluctuates due to manufacturing conditions and varies based on environmental temperature and power source voltages during the operation. Therefore, desired impedances are not necessarily obtained. Accordingly, to set the actual impedance to a desired value, a number of transistors to be turned on needs to be adjusted. For this purpose, a parallel circuit including plural output transistors is used.

In order to adjust impedances of the output buffer 100 finely and widely, it is preferable to have mutually different W/L ratios (gate width/gate length ratios) of plural output transistors constituting the pull-up circuit PU and the pull-down circuit PD. Particularly, it is preferable to add weights of a power of two. That is, when a W/L ratio of the output transistor 111 is "1 WLp", it is particularly preferable to set W/L ratios of the output transistors 112 to 115 to "2 WLp", "4 WLp", "8 WLp", and "16 WLp", respectively. Similarly, when a W/L ratio of the output transistor 121 is "1 WLn", it is particularly preferable to set W/L ratios of the output transistors 122 to 125 to "2 WLn", "4 WLn", "8 WLn", and "16 WLn", respectively.

Based on the above configurations, by suitably selecting output transistors to be turned on by the operation signals PonB1 to PonB5 and NonB1 to NonB5, impedances of the pull-up circuit PU and the pull-down circuit PD can be set to desired values regardless of fluctuations due to manufacturing conditions, temperature changes and the like.

Figure 3:
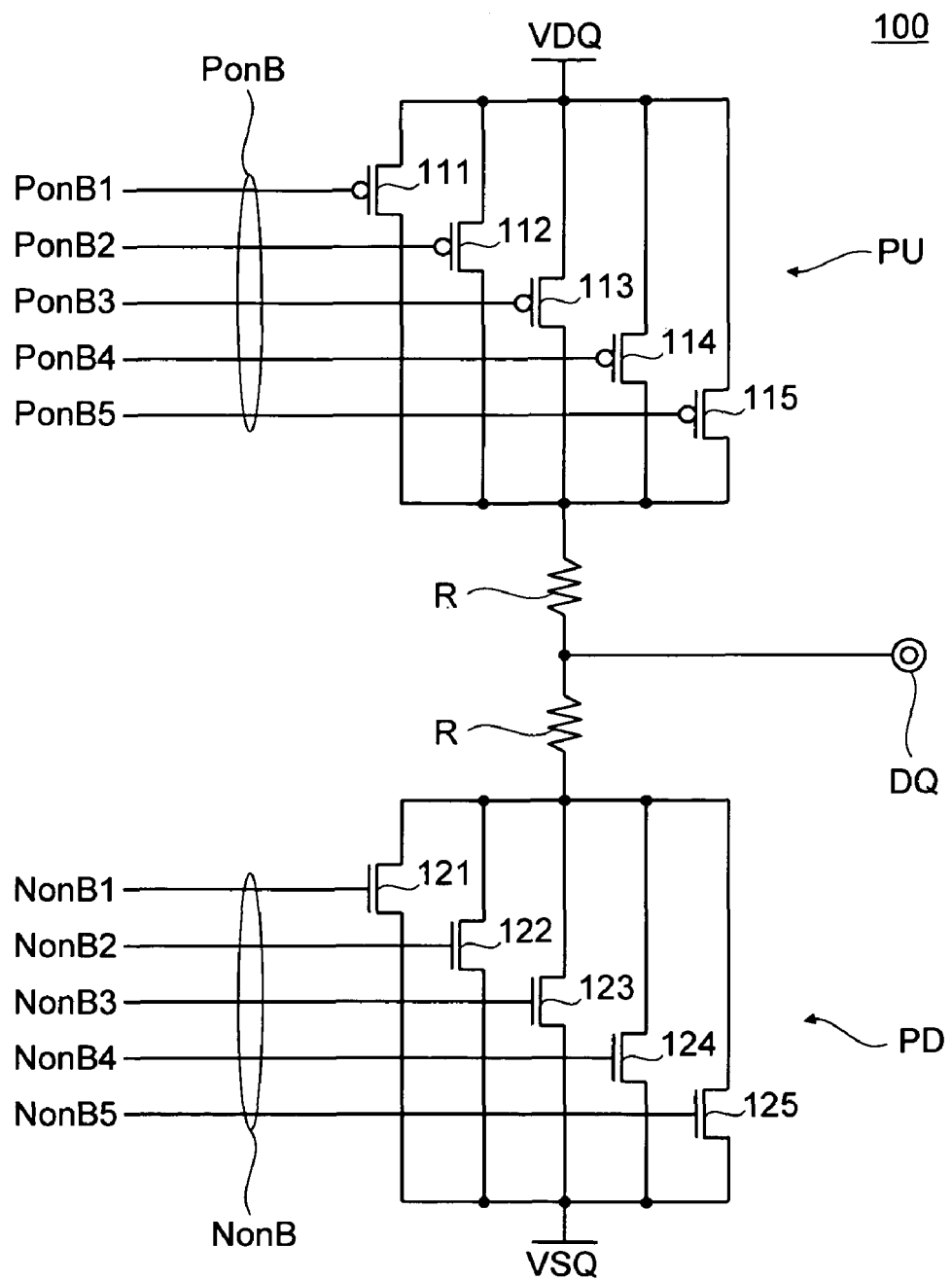
FIG. 3 is a circuit diagram showing a modified example of the output buffer 100.

However, a configuration of the output buffer 100 is not limited to the circuits shown in FIG. 2. A resistor R can be inserted into between the data output terminal DQ and the pull up circuit PU, and between the data output terminal DQ and the pull-down circuit PD, respectively, as shown in FIG. 3. A tungsten (W) resistor can be used for these resistors R, for example.

Figure 4:
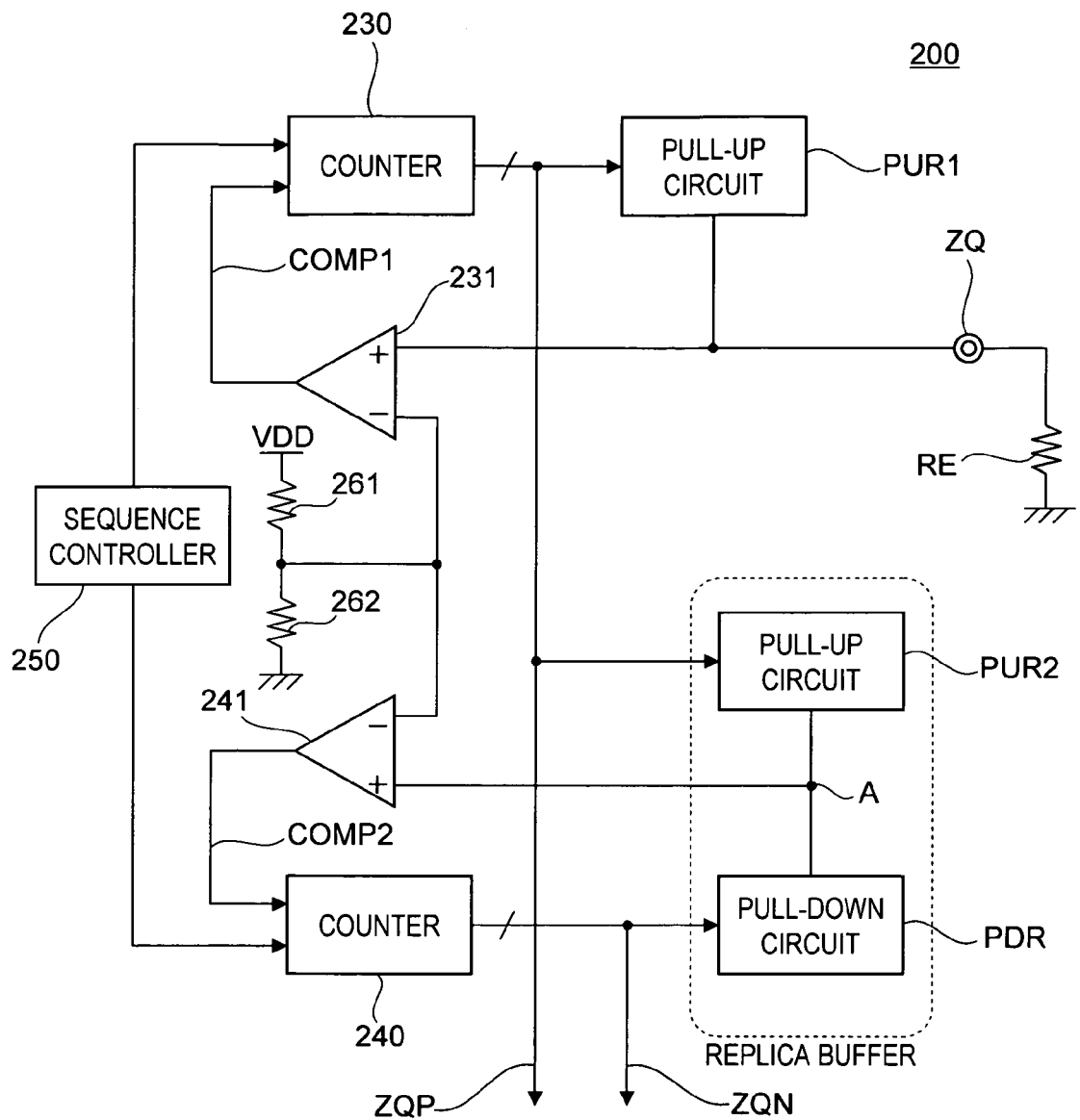
FIG. 4 is a circuit diagram of the calibration circuit 200.

FIG. 4 is a circuit diagram of the calibration circuit 200.

As shown in FIG. 4, the calibration circuit 200 includes pull-up circuits PUR1 and PUR2, a pull-down circuit PDR, a counter 230 that controls operations of the pull-up circuits PUR1 and PUR2, a counter 240 that controls an operation of the pull-down circuit PDR, comparators 231 and 241 that respectively control the counters 230 and 240, and a sequence controller 250 that controls operations of the counters 230 and 240.

Figure 5:
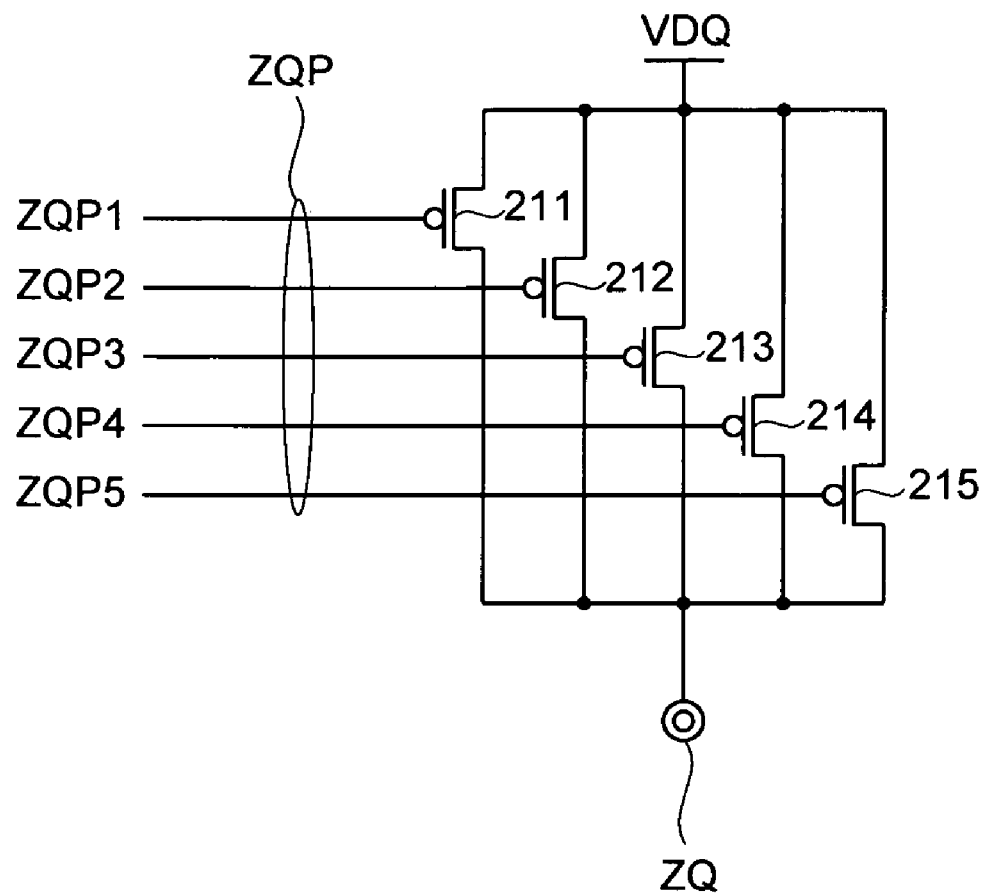
FIG. 5 is a circuit diagram of the pull-up circuit PUR1.

FIG. 5 is a circuit diagram of the pull-up circuit PUR1.

As shown in FIG. 5, the pull-up circuit PUR1 has a circuit configuration substantially the same as that of the pull-up circuit PU included in the output buffer 100, except that a drain is connected to the calibration terminal ZQ. Specifically, the pull-up circuit PUR1 is configured by plural (five in the present embodiment) P-channel MOS transistors 211 to 215 connected in parallel between the power source potential VDQ and the calibration terminal ZQ. The transistors 211 to 215 included in the pull-up circuit PUR1 correspond to the transistors 111 to 115 shown in FIG. 2, and have the same impedances as those of the transistors 111 to 115, respectively. However, so long as the impedances are substantially the same, the transistors 211 to 215 included in the pull-up circuit PUR1 and the transistors 111 to 115 shown in FIG. 2 do not need to have exactly the same transistor sizes, and shrunk transistors can be used.

As shown in FIG. 4, an external resistor RE is connected to the calibration terminal ZQ. An impedance of the external resistor RE matches the impedances of the pull-up circuit PU and the pull-down circuit PD constituting the output buffer 100. In other words, the external resistor RE having the same impedance as impedance target values of the pull-up circuit PU and the pull-down circuit PD is connected to the calibration terminal ZQ.

Impedance adjustment signals ZQP1 to ZQP5 are applied from the counter 230 to gates of the transistors 211 to 215, respectively, thereby controlling the operation of the pull-up circuit PUR1. The impedance adjustment signals ZQP1 to ZQP5 constitute the impedance adjustment signal ZQP shown in FIG. 1. The impedance adjustment signals ZQP1 to ZQP5 are signals corresponding to the output transistors 111 to 115 constituting the output buffer 100, respectively, and designate output transistors to be used among the output transistors 111 to 115. Therefore, when the output transistors 111 to 115 are weighted, corresponding weights are also added to the impedance adjustment signals ZQP1 to ZQP5.

The pull-up circuit PUR2 has the same circuit configuration as that of the pull-up circuit PUR1 shown in FIG. 5, except that a drain side is connected to a node A shown in FIG. 4. Therefore, the impedance adjustment signals ZQP1 to ZQP5 are also supplied to gates of five transistors included in the pull-up circuit PUR2.

Figure 6:
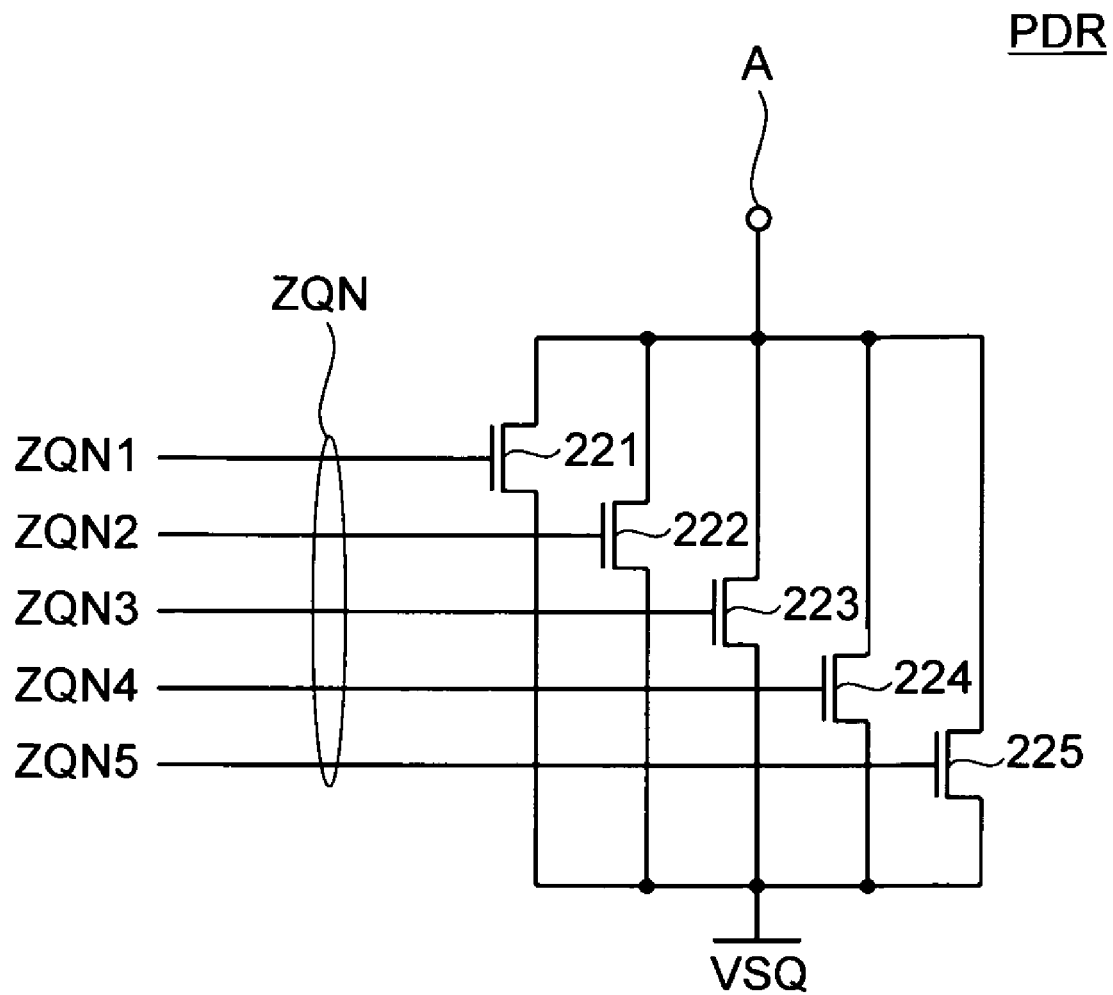
FIG. 6 is a circuit diagram of the pull-down circuit PDR.

FIG. 6 is a circuit diagram of the pull-down circuit PDR.

As shown in FIG. 6, the pull-down circuit PDR has substantially the same circuit configuration as that of the pull-down circuit PD included in the output buffer 100, except that a drain is connected to the node A. Specifically, the pull-down circuit PDR is configured by plural (five in the present embodiment) N-channel MOS transistors 221 to 225 connected in parallel between the node A and the ground potential VSQ. The transistors 221 to 225 included in the pull-down circuit PDR correspond to the transistors 121 to 125 shown in FIG. 2, and have the same impedances as those of the transistors 121 to 125, respectively. However, so long as the impedances are substantially the same, the transistors 221 to 225 included in the pull-down circuit PDR and the transistors 121 to 125 shown in FIG. 2 do not need to have exactly the same transistor sizes, and shrunk transistors can be used.

Impedance adjustment signals ZQN1 to ZQN5 are applied from the counter 240 to gates of the transistors 221 to 225, respectively, thereby controlling the operation of the pull-down circuit PDR. The impedance adjustment signals ZQN1 to ZQN5 constitute the impedance adjustment signal ZQN shown in FIG. 1. The impedance adjustment signals ZQN1 to ZQN5 are signals corresponding to the output transistors 121 to 125 constituting the output buffer 100, respectively, and designate output transistors to be used among the output transistors 121 to 125. Therefore, when the output transistors 121 to 125 are weighted, corresponding weights are also added to the impedance adjustment signals ZQN1 to ZQN5.

As shown in FIG. 4, the pull-up circuit PUR2 and the pull-down circuit PDR are connected to each other via the node A. Therefore, the pull-up circuit PUR2 and the pull-down circuit PDR constitute a replica buffer having substantially the same circuit configuration as that of the output buffer 100. The "substantially the same" in this context means that even when transistors included in the replica buffer are shrunk, the transistors are regarded as the same. The node A as an output end of the replica buffer is connected to a non-inverting input terminal (+) of the comparator 241, as shown in FIG. 4.

The counter 230 counts up or counts down corresponding to an output of the comparator 231, and an output of the counter 230 is used as the impedance adjustment signal ZQP. The counter 230 counts up when a comparison signal COMP1 as the output of the comparator 231 is at a high level, and counts down when the comparison signal COMP1 is at a low level. A non-inverting input terminal (+) of the comparator 231 is connected to the calibration terminal ZQ, and an inverting input terminal (−) is connected to an intermediate point of resistors 261 and 262 connected between a power source potential (VDD) and a ground potential (GND). Based on this configuration, the comparator 231 compares a potential of the calibration terminal ZQ with an intermediate voltage (VDD/2). When the potential of the calibration terminal ZQ is higher, the comparator 231 sets the comparison signal COMP1 to a high level. When the intermediate voltage (VDD/2) is higher, the comparator 231 sets the comparison signal COMP1 to a low level.

Meanwhile, the counter 240 counts up or counts down corresponding to an output of the comparator 241, and an output of the counter 240 is used as the impedance adjustment signal ZQN. The counter 240 counts up when a comparison signal COMP2 as the output of the comparator 241 is at a high level, and counts down when the comparison signal COMP2 is at a low level. A non-inverting input terminal (+) of the comparator 241 is connected to the node A, and an inverting input terminal (−) is connected to an intermediate point of the resistors 261 and 262. Based on this configuration, the comparator 241 compares a potential of the node A with the intermediate voltage (VDD/2). When the potential of the node A is higher, the comparator 241 sets the comparison signal COMP2 to a high level. When the intermediate voltage (VDD/2) is higher, the comparator 241 sets the comparison signal COMP2 to a low level.

The counters 230 and 240 perform a counting operation based on control by the sequence controller 250, thereby adjusting impedances of the pull-up circuits PUR1 and PUR2 and the pull-down circuit PDR.

Figure 7:
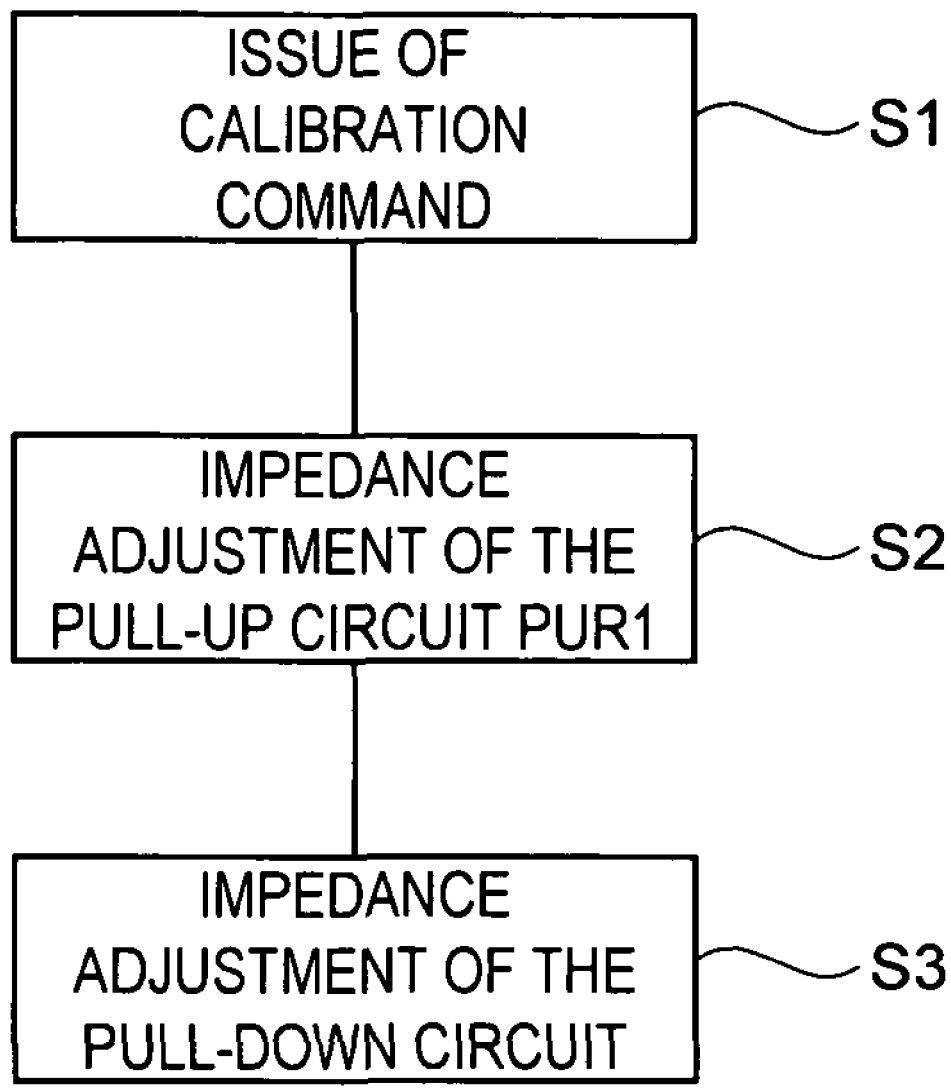
FIG. 7 is a flowchart for showing an operation of the calibration circuit 200.

FIG. 7 is a flowchart for showing an operation of the calibration circuit 200.

First, when a calibration command is issued from outside (Step S1), the sequence controller 250 permits an operation of the counter 230. As a result, a count value of the counter 230 is determined to match the impedance of the pull-up circuit PUR1 with the impedance of the external resistor RE (Step S2). Specifically, when a potential of the calibration terminal ZQ is higher than the intermediate voltage (VDD/2), the comparison signal COMP1 becomes a high level, and therefore, the counter 230 counts up. Accordingly, the impedance of the pull-up circuit PUR1 is gradually increased. On the other hand, when a potential of the calibration terminal ZQ is lower than the intermediate voltage (VDD/2), the comparison signal COMP1 becomes a low level, and therefore, the counter 230 counts down. Accordingly, the impedance of the pull-up circuit PUR1 is gradually decreased.

By performing the above operation, the impedance adjustment signal ZQP as a count value of the counter 230 is adjusted to match the impedance of the pull-up circuit PUR1 with the impedance of the external resistor RE. As shown in FIG. 4, because the impedance adjustment signal ZQP is also supplied to the pull-up circuit PUR2, the impedance of the pull-up circuit PUR2 also matches the impedance of the external resistor RE.

After the adjustment of the pull-up circuits PUR1 and PUR2 is finished, the sequence controller 250 permits the operation of the counter 240, and adjusts the pull-down circuit PDR (Step S3). Specifically, when the potential of the node A is higher than the intermediate voltage (VDD/2), the comparison signal COMP2 becomes a high level, and therefore, the counter 240 counts up. Accordingly, the impedance of the pull-down circuit PDR is gradually decreased. On the other hand, when the potential of the node A is lower than the intermediate voltage (VDD/2), the comparison signal COMP2 becomes a low level, and therefore, the counter 240 counts down. Accordingly, the impedance of the pull-down circuit PDR is gradually increased.

By performing the above operation, the impedance adjustment signal ZQN as a count value of the counter 240 is adjusted to match the impedance of the pull-down circuit PDR with the impedance of the pull-up circuit PUR2. As described above, because the impedance of the pull-up circuit PUR2 matches the impedance of the external resistor RE, the impedance of the pull-down circuit PDR also matches the impedance of the external resistor RE by the operation described above.

The impedance adjustment signals ZQP and ZQN generated as described above are supplied to the output control circuit 300 and the through-rate control circuit 400 as shown in FIG. 1.

Figure 8:
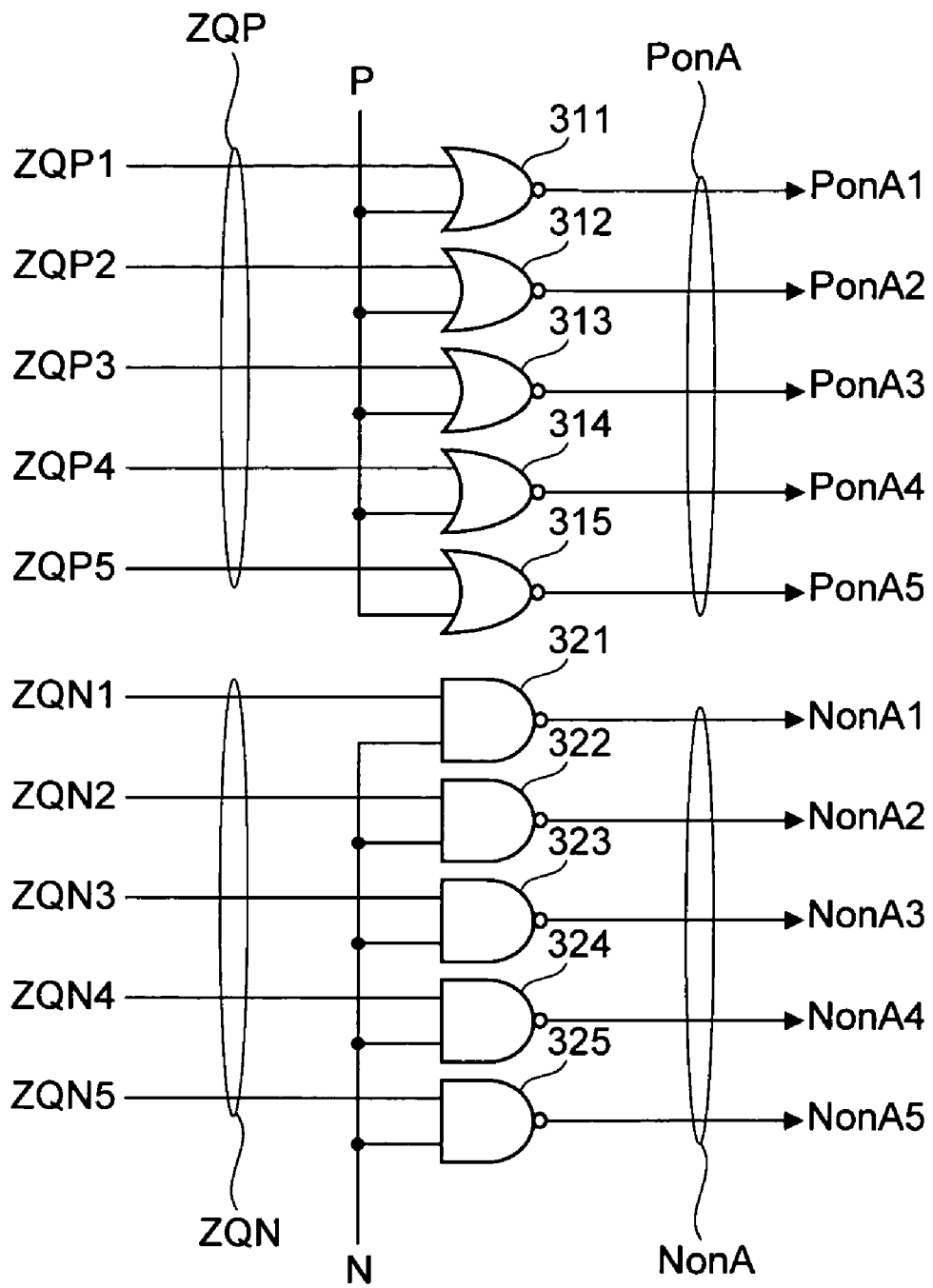
FIG. 8 is a circuit diagram of the output control circuit 300.

FIG. 8 is a circuit diagram of the output control circuit 300.

As shown in FIG. 8, the output control circuit 300 is configured by five NOR circuits 311 to 315 and five NAND circuits 321 to 325. A data signal P is supplied commonly to the NOR circuits 311 to 315, and the impedance adjustment signals ZQP1 to ZQP5 are supplied respectively to the NOR circuits 311 to 315. On the other hand, a data signal N is supplied commonly to the NAND circuits 321 to 325, and the impedance adjustment signals ZQN1 to ZQN5 are supplied respectively to the NAND circuits 321 to 325.

The data signals P and N represent logic values of data to be output. The data signals P and N are set to a low level when data to be output from the data output terminal DQ is at a high level, and are set to a high level when data to be output from the data output terminal DQ is at a low level. Therefore, the data signal P and N can be set as a single signal. However, when the output buffer 100 performs an ODT operation, the data signal P needs to be at a low level, and the data signal N needs to be at a high level. Consequently, separate signals are used in the present embodiment by taking the above case into consideration. As described above, the data signals P and N are signals generated by an internal circuit (not shown).

Based on the above configuration, when the data signals P and N are at a low level, at least one of the operation signals PonA1 to PonA5 as outputs of the NOR circuits 311 to 315 is activated to a high level. On the other hand, the operation signals NonA1 to NonA5 as outputs of the NAND circuits 321 to 325 are all inactivated to a high level. In this case, which one of the operation signals PonA1 to PonA5 is to be activated is determined by the impedance adjustment signal ZQP. The operation signals PonA1 to PonA5 constitute the operation signal PonA shown in FIG. 1.

Similarly, when the data signals P and N are at a high level, at least one of the operation signals NonA1 to NonA5 as outputs of the NAND circuits 321 to 325 is activated to a low level. On the other hand, the operation signals PonA1 to PonA5 as outputs of the NOR circuits 311 to 315 are all inactivated to a low level. In this case, which one of the operation signals NonA1 to NonA5 is to be activated is determined by the impedance adjustment signal ZQN. The operation signals NonA1 to NonA5 constitute the operation signal NonA shown in FIG. 1.

Figure 9:
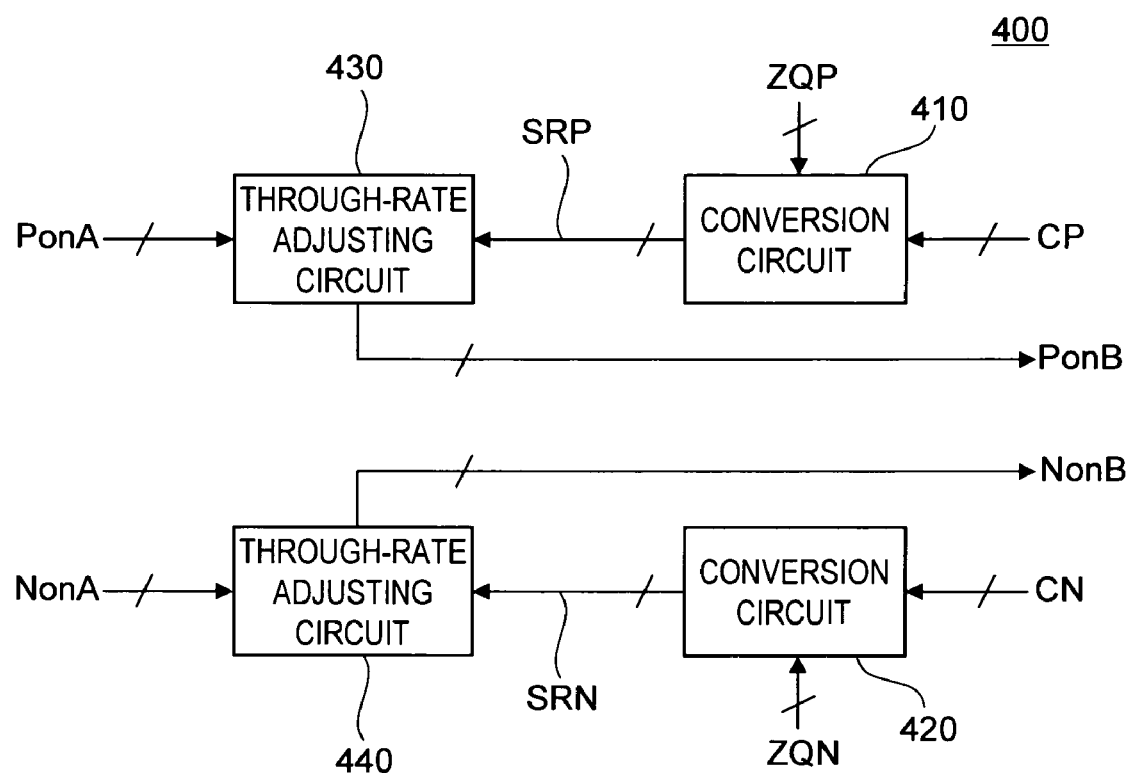
FIG. 9 is a circuit diagram of the through-rate control circuit 400.

FIG. 9 is a circuit diagram of the through-rate control circuit 400.

As shown in FIG. 9, the through-rate control circuit 400 is configured by conversion circuits 410 and 420 and through-rate adjusting circuits 430 and 440.

The conversion circuit 410 generates a through-rate adjustment signal SRP based on the impedance adjustment signal ZQP and the through-rate setting signal CP. Specifically, the conversion circuit 410 converts the through-rate setting signal CP to the through-rate adjustment signal SRP to obtain a higher through rate than a through rate obtained by the through-rate setting signal CP when the impedance adjustment signal ZQP designates a lower impedance. On the other hand, the conversion circuit 410 converts the through-rate setting signal CP to the through-rate adjustment signal SRP to obtain a lower through rate than a through rate obtained by the through-rate setting signal CP when the impedance adjustment signal ZQP designates a higher impedance. The through-rate adjustment signal SRP adjusts a through rate of the pull up circuit PU included in the output buffer 100.

Similarly, the conversion circuit 420 converts the through-rate setting signal CN to the through-rate adjustment signal SRN to obtain a higher through rate than a through rate obtained by the through-rate setting signal CN when the impedance adjustment signal ZQN designates a lower impedance. On the other hand, the conversion circuit 420 converts the through-rate setting signal CN to the through-rate adjustment signal SRN to obtain a lower through rate than a through rate obtained by the through-rate setting signal CN when the impedance adjustment signal ZQN designates a higher impedance. The through-rate adjustment signal SRN adjusts a through rate of the pull down circuit PD included in the output buffer 100.

FIGS. 10A and 10B are an example, respectively of a converting operation of the conversion circuits 410 and 420, although a specific example of the operation is not particularly limited. FIG. 10A is a table for explaining a converting operation based on the impedance adjustment signal ZQP, and FIG. 10B is a table for explaining a converting operation based on the impedance adjustment signal ZQN. In FIGS. 10A and 10B, "X" denotes "don't care".

In the example shown in FIG. 10A, the through-rate setting signal CP is converted to the through-rate adjustment signal SRP to more decrease the through rate when a value of the impedance adjustment signal ZQP becomes larger (when the impedance of a designated pull-up circuit PU becomes higher) On the other hand, the through-rate setting signal CP is converted to the through-rate adjustment signal SRP to more increase the through rate when a value of the impedance adjustment signal ZQP becomes smaller (when the impedance of a designated pull-up circuit PU becomes lower).

Similarly, in the example shown in FIG. 10B, the through-rate setting signal CN is converted to the through-rate adjustment signal SRN to more increase the through rate when a value of the impedance adjustment signal ZQN becomes larger (when the impedance of a designated pull-down circuit PD becomes lower). On the other hand, the through-rate setting signal CN is converted to the through-rate adjustment signal SRN to more decrease the through rate when a value of the impedance adjustment signal ZQN becomes smaller (when the impedance of a designated pull-down circuit PD becomes higher).

While a specific circuit configuration to achieve the converting operation is not described, it is possible to easily achieve the operation by combining various kinds of logic circuits. Further, when values of the through-rate setting signals CP and CN are clear at a design stage, circuit configurations of the conversion circuits 410 and 420 can be substantially simplified. This corresponds to a case where although a through rate of the output buffer 100 is designed to be able to be selected in manufacturing at the beginning of the design, selection of through rate in manufacturing becomes unnecessary at a final design stage.

Figure 11:
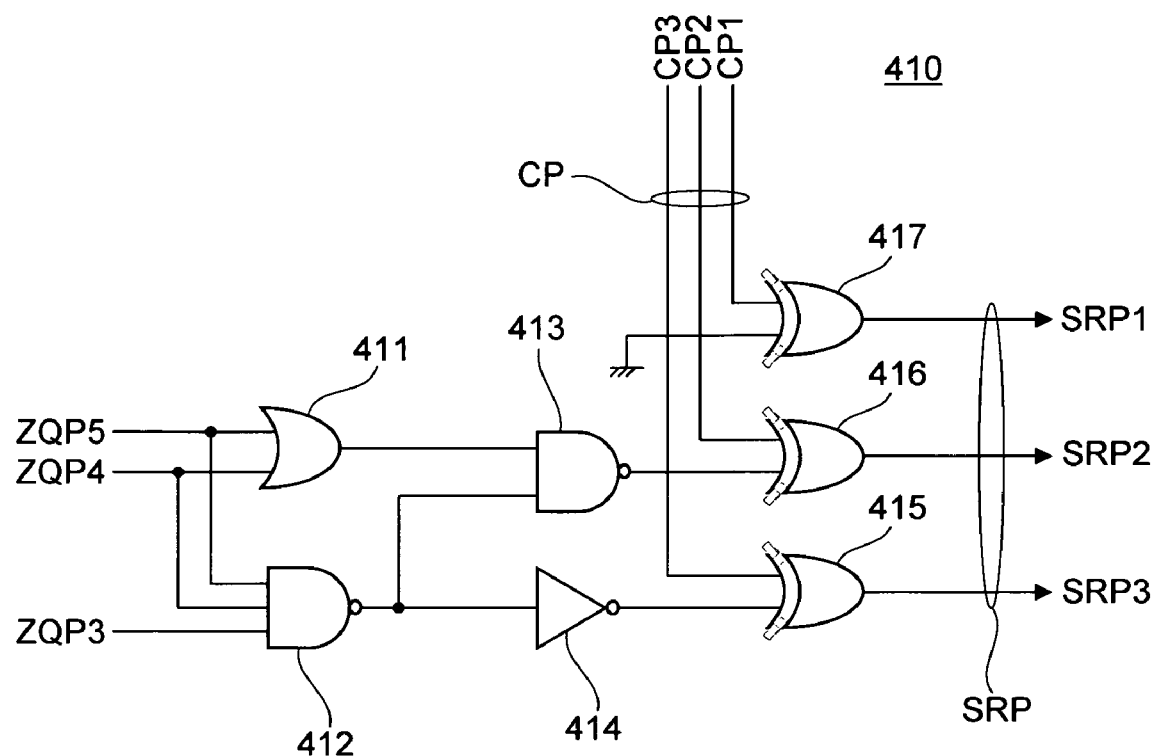
FIG. 11 is a circuit diagram of the conversion circuit 410.

FIG. 11 is a circuit diagram of the conversion circuit 410 when values of CP3 to CP1 constituting the through-rate setting signal CP are known in advance as "100". The through-rate setting signals CP3 to CP1 are weighted, and CP3 is a highest-order bit.

In the example shown in FIG. 11, the conversion circuit 410 includes an OR circuit 411 that receives high-order two bits ZQP5 and ZQP4 of the impedance adjustment signal ZQP, a NAND circuit 412 that receives high-order three bits ZQP5 to ZQP3 of the impedance adjustment signal ZQP, a NAND circuit 413 that receives outputs of the OR circuit 411 and the NAND circuit 412, and an inverter circuit 414 that inverts the output of the NAND circuit 412.

An output of the inverter circuit 414 and the highest-order bit CP3 of the through-rate setting signal CP are supplied to an EXOR circuit 415. An output of the EXOR circuit 415 becomes a highest-order bit SRP3 of the through-rate adjustment signal SRP. An output of the NAND circuit 413 and CP2 as a high-order second bit are supplied to an EXOR circuit 416. An output of the EXOR circuit 416 becomes SRP2 as a high-order second bit of the through-rate adjustment signal SRP. Further, CP1 as a lowest-order bit of the through-rate setting signal CP and a signal fixed to a low level are supplied to an EXOR circuit 417. An output of the EXOR circuit 417 becomes a lowest-order bit SRP1 of the through-rate adjustment signal SRP. Because logic levels of CP1 and SRP1 coincide with each other, the EXOR circuit 417 can be logically deleted. However, to match output timings of the through-rate setting signals SRP3 to SRP1, the EXOR circuit 417 is preferably used, in a similar manner to that of the EXOR circuits 415 and 416.

According to the above circuit configuration, when the impedance adjustment signal ZQP is "00XXX" from a high order (X denotes "don't care"), a value "100" of the through-rate setting signal CP is converted to "110", and is output as the impedance adjustment signal SRP. That is, in this case, the through-rate adjustment signal SRP which is two pitches higher than the through-rate setting signal CP is generated. On the other hand, when the impedance adjustment signal ZQP is "111XX" from a high order (X denotes "don't care"), a value "100" of the through-rate setting signal CP is converted to "010", and is output as the impedance adjustment signal SRP. That is, in this case, the through-rate adjustment signal SRP which is two pitches lower than the through-rate setting signal CP is generated.

A similar circuit can be used for the conversion circuit 420 that adjusts a through rate at the pull-down side.

As explained above, when values of the through-rate setting signals CP and CN are known at a design stage, circuit configurations of the conversion circuits 410 and 420 can be substantially simplified.

The through-rate adjustment signals SRP and SRN generated by the conversion circuits 410 and 420 are supplied to the through-rate adjusting circuits 430 and 440, respectively shown in FIG. 9.

Figure 12:
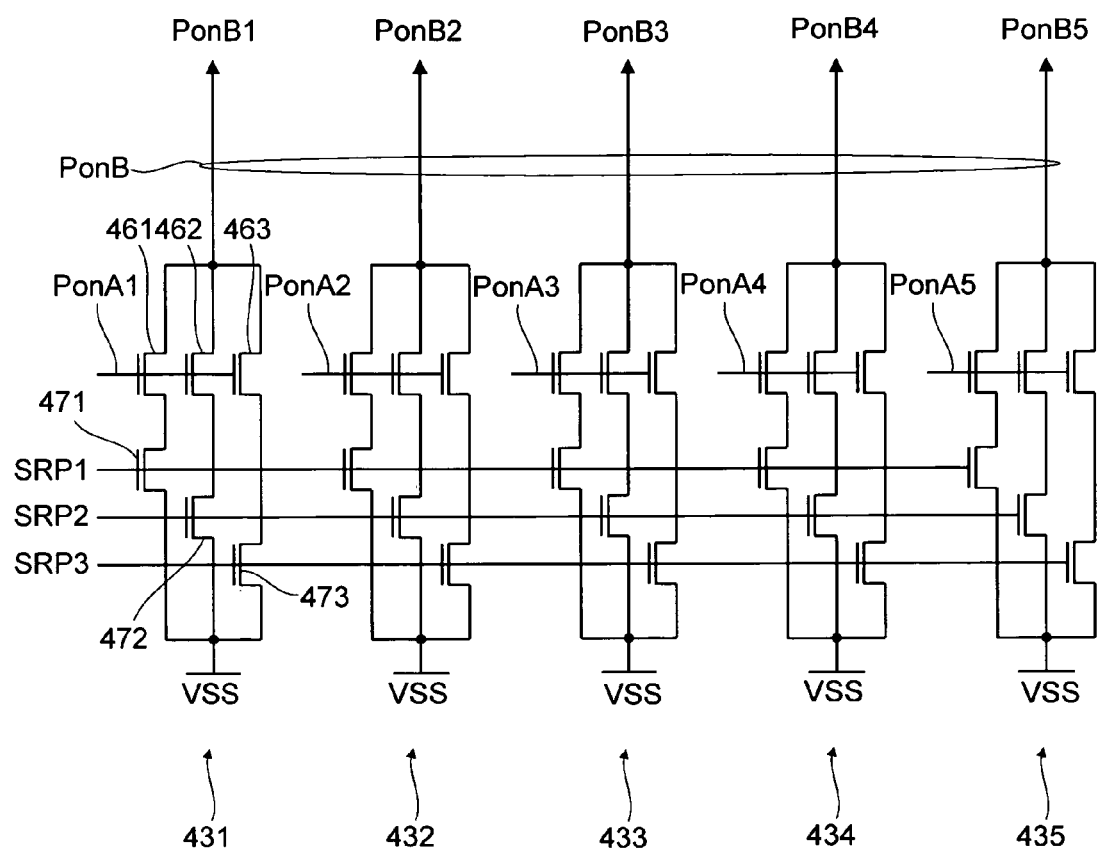
FIG. 12 is a circuit diagram of the through-rate adjusting circuit 430.

FIG. 12 is a circuit diagram of the through-rate adjusting circuit 430.

As shown in FIG. 12, the through-rate adjusting circuit 430 is configured by driving circuits 431 to 435 that generate the ON signals PonB1 to PonB5, respectively based on the ON signals PonA1 to PonA5. The driving circuit 431 has a configuration having three series circuits connected in parallel. In the three series circuits, each of N-channel MOS transistors (selection transistors) 461 to 463 to which the ON signal PonA1 is supplied and each of N-channel MOS transistors (adjustment transistors) 471 to 473 to which the through-rate adjustment signals SRP1 to SRP3 are supplied are connected in series. As described above, the through-rate adjustment signals SRP1 to SRP3 are generated based on the impedance adjustment signal ZQP.

When each bit constituting the through-rate adjustment signal SRP is weighted, it is preferable to have mutually different W/L ratios (gate width/gate length ratios) corresponding to weights for at least the adjustment transistors 471 to 473. Specifically, when weights of the through-rate adjustment signals SRP1 to SRP3 are "1", "2", and "4", respectively, it suffices that W/L ratios of the adjustment transistors 472 and 473 are set to "2 WLps" and "4 WLps", respectively, when a W/L ratio of the adjustment transistor 471 is "1 WLps".

Other driving circuits 432 to 435 also have circuit configurations similar to that of the driving circuit 431, except that ON signals PonA2 to PonA5 are supplied to the driving circuits 432 to 435, respectively.

Based on the above circuit configurations, for the driving circuits 431 to 435 of which corresponding ON signals PonA1 to PonA5 are at an active level (high level), the ON signals PonB1 to PonB5 as outputs of the driving circuits 431 to 435 are activated to a low level. Waveforms of the ON signals PonB1 to PonB5 based on the activation of the ON signals PonA1 to PonA5 are adjusted by the through-rate adjustment signal SRP. Specifically, when the through-rate adjustment signal SRP designates a higher through rate, a fall of the ON signals PonB1 to PonB5 becomes steeper. On the other hand, when the through-rate adjustment signal SRP designates a lower through rate, a fall of the ON signals PonB1 to PonB5 becomes milder.

The ON signals PonB1 to PonB5 generated as described above are supplied to the pull-up circuit PU of the output buffer 100 shown in FIG. 2. Therefore, the impedance of the pull-up circuit PU is adjusted to the same impedance as those of the pull-up circuits PUR1 and PUR2 included in the calibration circuit 200. The through rate of the pull-up circuit PU is determined by the through-rate adjustment signal SRP.

Figure 13:
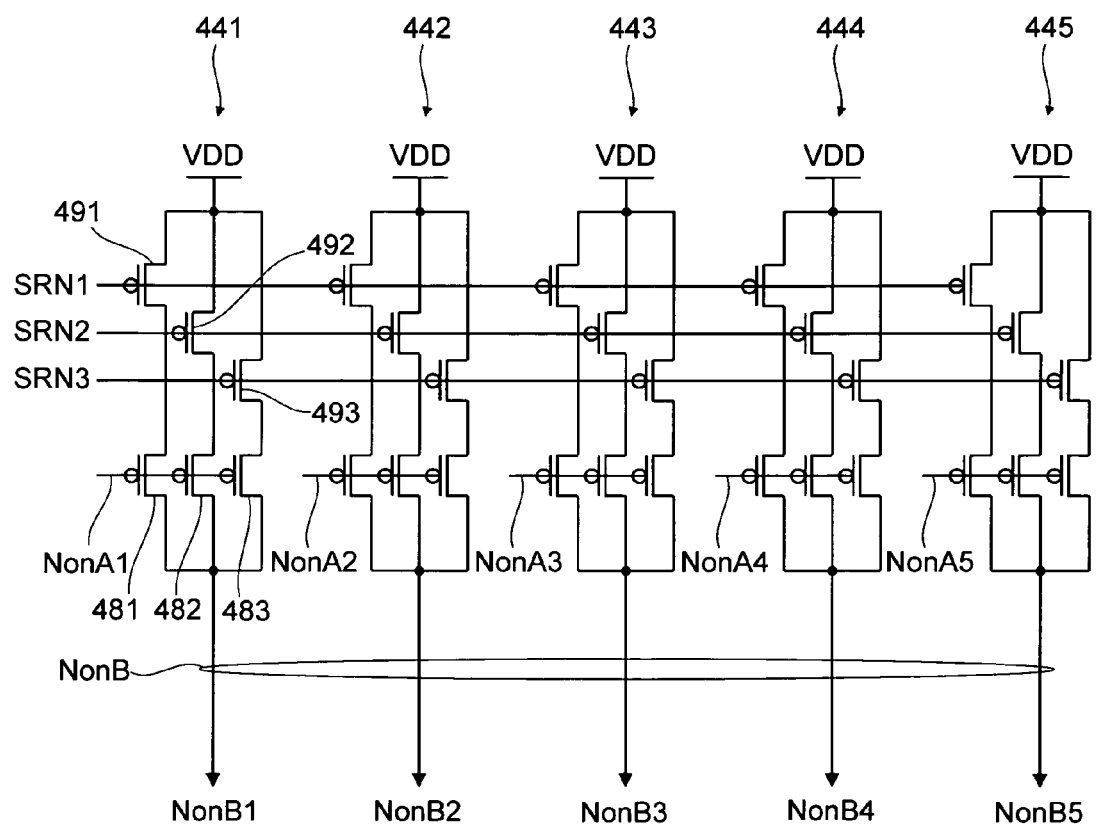
FIG. 13 is a circuit diagram of the through-rate adjusting circuit 440.

FIG. 13 is a circuit diagram of the through-rate adjusting circuit 440.

As shown in FIG. 13, the through-rate adjusting circuit 440 is configured by driving circuits 441 to 445 that generate the ON signals NonB1 to NonB5, respectively based on the ON signals NonA1 to NonA5. The driving circuit 441 has a configuration having three series circuits connected in parallel. In the three series circuits, each of P-channel MOS transistors (selection transistors) 481 to 483 to which the ON signal NonA1 is supplied and each of P-channel MOS transistors (adjustment transistors) 491 to 493 to which the through-rate adjustment signals SRN1 to SRN3 are supplied are connected in series. As described above, the through-rate adjustment signals SRN1 to SRN3 are generated based on the impedance adjustment signal ZQN.

For the through-rate adjusting circuit 440, when each bit constituting the through-rate adjustment signal SRN is weighted, it is also preferable to have mutually different W/L ratios (gate width/gate length ratios) corresponding to weights for at least the adjustment transistors 491 to 493. Specifically, when weights of the through-rate adjustment signals SRN1 to SRN3 are "1", "2", and "4", respectively, it suffices that W/L ratios of the adjustment transistors 492 and 493 are set to "2 WLns" and "4 WLns", respectively, when a W/L ratio of the adjustment transistor 491 is "1 WLns".

Other driving circuits 442 to 445 also have circuit configurations similar to that of the driving circuit 441, except that ON signals NonA2 to NonA5 are supplied to the driving circuits 442 to 445, respectively.

Based on the above circuit configurations, for the driving circuits 441 to 445 of which corresponding ON signals NonA1 to NonA5 are at an active level (low level), the ON signals NonB1 to NonB5 as outputs of the driving circuits 441 to 445 are activated to a high level. Waveforms of the ON signals NonB1 to NonB5 based on the activation of the ON signals NonA1 to NonA5 are adjusted by the through-rate adjustment signal SRN. Specifically, when the through-rate adjustment signal SRN designates a higher through rate, a rise of the ON signals NonB1 to NonB5 becomes steeper. On the other hand, when the through-rate adjustment signal SRN designates a lower through rate, a rise of the ON signals NonB1 to NonB5 becomes milder.

The ON signals NonB1 to NonB5 generated as described above are supplied to the pull-down circuit PD of the output buffer 100 shown in FIG. 2. Therefore, the impedance of the pull-down circuit PD is adjusted to the same impedance as that of the pull-down circuit PDR included in the calibration circuit 200. The through rate of the pull-down circuit PD is determined by the through-rate adjustment signal SRN.

In this way, the through-rate adjusting circuits 430 and 440 function to generate the ON signals PonB and NonB of which waveforms are adjusted, based on the ON signals PonA and NonA. As described above, while waveforms of the ON signals PonB and NonB are controlled by the through-rate adjustment signals SRP and SRN, values of the through-rate adjustment signals SRP and SRN are converted by the conversion circuits 410 and 420.

That is, by using values of the through-rate setting signals CP and CN as initial values, the through-rate adjustment signals SRP and SRN are generated by performing a conversion to increase the through rates of the pull-up circuit PU and the pull-down circuit PD when the impedance adjustment signals ZQP and ZQN designate lower impedances. On the other hand, the through-rate adjustment signal SRP is generated by performing a conversion to decrease the through rates of the pull-up circuit PU and the pull-down circuit PD when the impedance adjustment signals ZQP and ZQN designate higher impedances. As explained above, the through rates of the ON signals PonB and NonB supplied to the output buffer 100 are also adjusted by the impedance adjustment signals ZQP and ZQN obtained by the calibration operation, not only by the initial values of the through-rate setting signals CP and CN.

FIGS. 14A to 14D are waveform diagrams showing waveforms of the output data Dout output from the data output terminal DQ.

Figure 14:
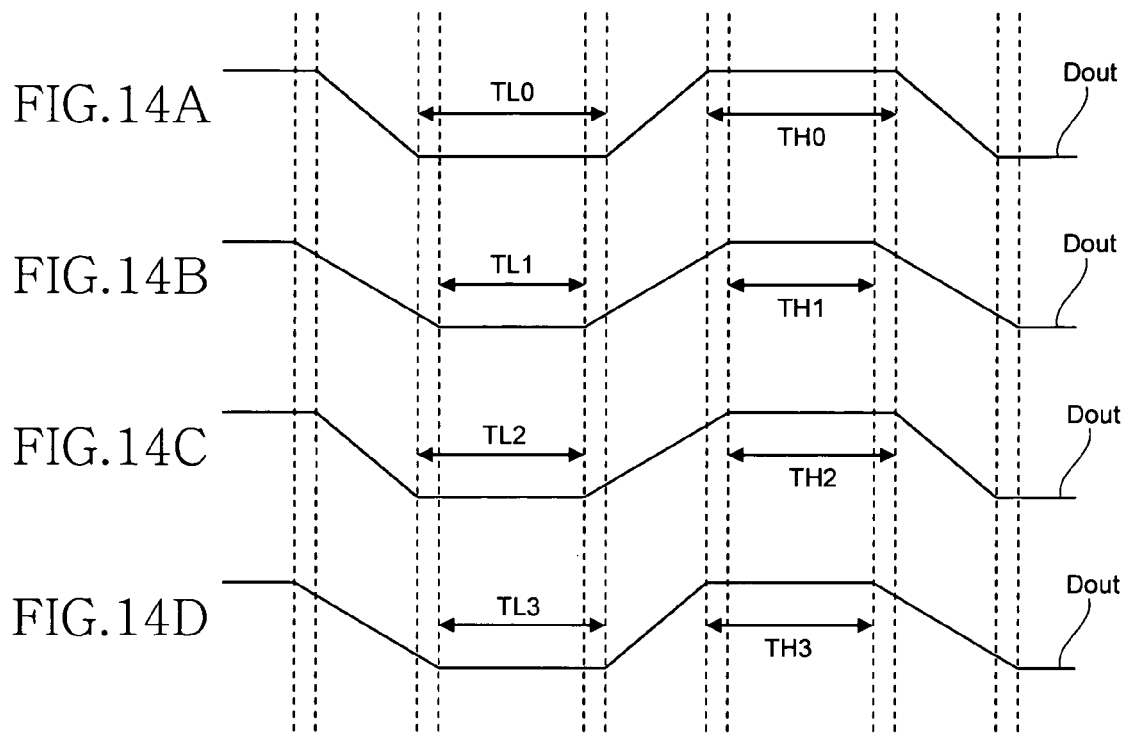
FIGS. 14A to 14D are waveform diagrams showing waveforms of the output data Dout output from the data output terminal DQ.

FIG. 14A is an example of a state that a through rate of the output buffer 100 is optimum. In this case, an effective range of the output data Dout is TL0 at the time of low level, and TH0 at the time of high level. Meanwhile, FIGS. 14B to 14D are examples of a state that a through rate of the output buffer 100 is in shortage. This shortage of the through rate occurs in a state that the impedance of the output buffer 100 is higher than a design value. In a state that the impedance increases higher than the design value, capacity of each output transistor constituting the output buffer 100 is lower than the design value. As a result, the through rate also tends to decrease.

In the example shown in FIG. 14B, impedances of the pull-up circuit PU and the pull-down circuit PD are higher than a design value, and therefore, the calibration circuit 200 needs to decrease the impedances of the pull-up circuit PU and the pull-down circuit PD. In this case, both the rise and the fall of the output data Dout change mildly due to the shortage of the through rate. As a result, the effective range of the output data Dout decreases to TL1 (<TL0) at the time of low level, and decreases to TH1 (<TH0) at the time of high level. However, according to the present embodiment, when the calibration circuit 200 decreases the impedances of the pull-up circuit PU and the pull-down circuit PD, the through rates of the pull-up circuit PU and the pull-down circuit PD are also increased in association with this decrease. Therefore, correction is performed to obtain the waveform shown in FIG. 14A.

The example shown in FIG. 14C is a case that impedance of the pull-up circuit PU is higher than a design value, and thus the calibration circuit 200 needs to decrease the impedance of the pull-up circuit PU. The example shown in FIG. 14D is a case that impedance of the pull-down circuit PD is higher than a design value, and thus the calibration circuit 200 needs to decrease the impedance of the pull-down circuit PD. In these cases, the rise or the fall of the output data Dout changes mildly due to the shortage of the through rate. As a result, the effective range of the output data Dout decreases to TL2 (<TL0) or TL3 (<TL0) at the time of low level, and decreases to TH2 (<TH0) or TH3 (<TH0) at the time of high level. However, according to the present embodiment, when the calibration circuit 200 decreases the impedance of the pull-up circuit PU or the pull-down circuit PD, the through rate of the pull-up circuit PU or the pull-down circuit PD is also increased in association to this decrease. Therefore, correction is performed to obtain the waveform shown in FIG. 14A.

While FIGS. 14A to 14D show cases that the calibration circuit 200 needs to decrease the impedance, cases that the calibration circuit 200 needs to increase the impedance are also the same. That is, in this case, when the calibration circuit 200 increases the impedance of the pull-up circuit PU or the pull-down circuit PD, the through rate of the pull-up circuit PU or the pull-down circuit PD is also decreased linked to this, thereby obtaining the correct waveform shown in FIG. 14A.

As explained above, the semiconductor device 10 according to the present embodiment sets a relatively high through rate of the output buffer 100 when the impedance adjustment signals ZQP and ZQN designate relatively low impedances. The semiconductor device 10 sets a relatively low through rate of the output buffer 100 when the impedance adjustment signals ZQP and ZQN designate relatively high impedances. Therefore, a through rate can be automatically adjusted without using an exclusive circuit (a ring oscillator or delay chains) that measures a through rate.

Further, more accurate through-rate adjustment can be performed because a through rate is adjusted based on an impedance of the output buffer 100 of which through rate is to be controlled, instead of using an exclusive circuit that measures the through rate.

It is apparent that the present invention is not limited to the above embodiments, but may be modified and changed without departing from the scope and spirit of the invention.

For example, in the above embodiment, the impedance of the output buffer 100 is indirectly measured by the calibration circuit 200, and the through rate of the output buffer 100 is adjusted by using a result of the measurement. Alternatively, the impedance of the output buffer 100 can be directly measured, and the through rate of the output buffer 100 can be adjusted by using a result of the measurement.

Further, in the above embodiment, the impedance of the output buffer 100 is measured by the calibration circuit 200 incorporated in the semiconductor device 10. However, it is not essential for the semiconductor device according to the present invention to incorporate the calibration circuit. Therefore, when the semiconductor device does not incorporate the calibration circuit, it suffices that a controller connected to the semiconductor device measures the impedance of the output buffer.

Figure 15:
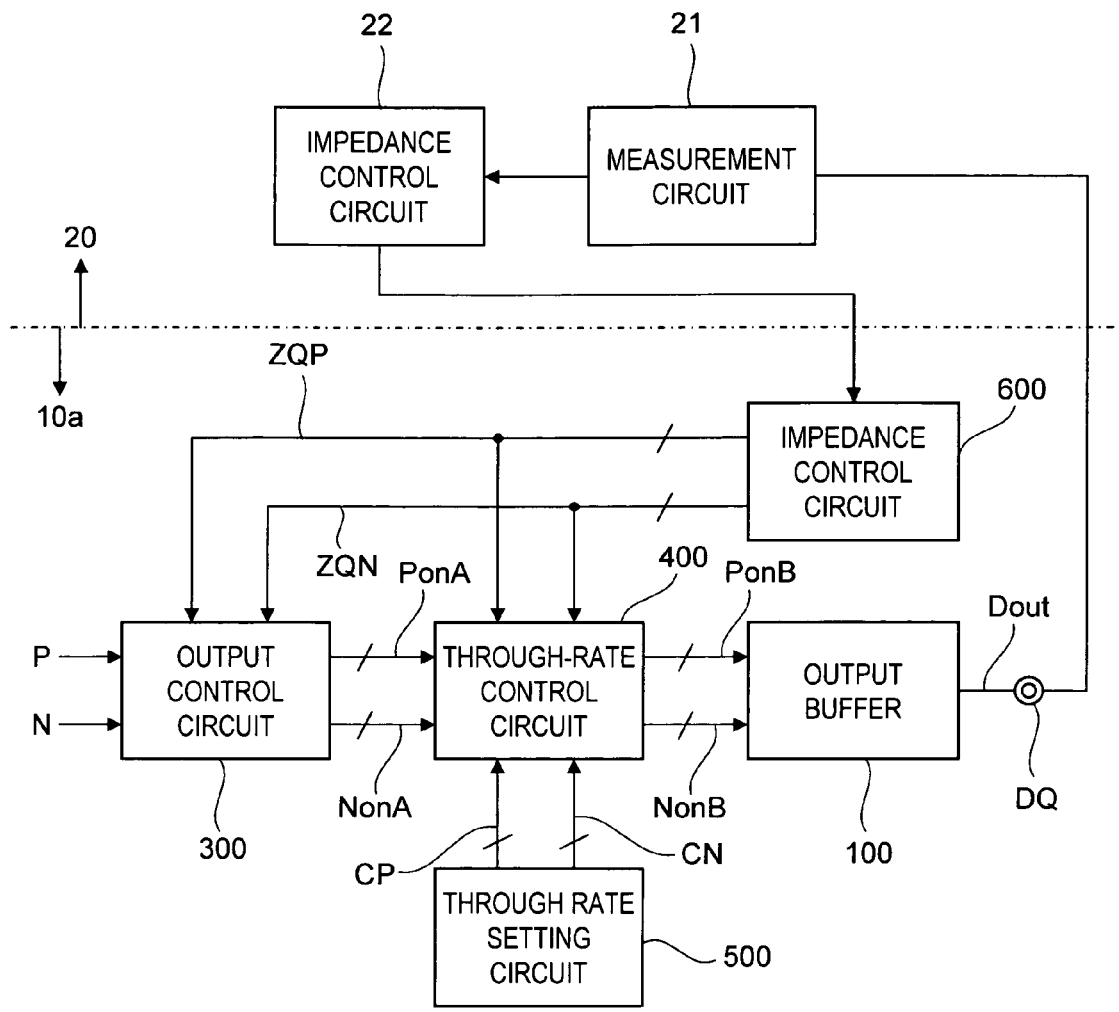
FIG. 15 is a block diagram showing an example that the controller measures the impedance of the output buffer.

FIG. 15 is a block diagram showing an example that the controller measures the impedance of the output buffer. In FIG. 15, constituent elements identical to those in the circuit shown in FIG. 1 are denoted by like reference characters, and redundant explanations thereof will be omitted.

In the example shown in FIG. 15, a controller 20 as a separate chip from that of a semiconductor device 10a is used. The controller 20 is connected to the data output terminal DQ of the semiconductor device 10a. A measurement circuit 21 directly measures the impedance of the output buffer 100. A control circuit 22 encodes the measured impedance, and transmits the encoded impedance to an impedance control circuit 600 included in the semiconductor device 10a. The impedance control circuit 600 generates the impedance adjustment signals ZQP and ZQN based on the encoded impedance, and supplies the impedance adjustment signals ZQP and ZQN to the output control circuit 300 and the through-rate control circuit 400 in a similar manner to that of the above embodiment. As explained above, the present invention can be also applied to the semiconductor device not including the calibration circuit. In the example shown in FIG. 15, the impedance control circuit 600 within the semiconductor device 10a generates the impedance adjustment signals ZQP and ZQN. Alternatively, the control circuit 22 within the controller 20 can generate the impedance adjustment signals ZQP and ZQN.

Further, in the above embodiment, values of the through-rate setting signals CP and CN are used as initial values, and the through-rate adjustment signals SRP and SRN are generated by converting these values based on the impedance adjustment signals ZQP and ZQN. However, the use of these values of the through-rate setting signals CP and CN is not essential. That is, the through rate of the output buffer 100 can be adjusted by using only the impedance adjustment signals ZQP and ZQN.

In the above embodiment, while each of the pull-up circuit PU and the pull-down circuit PD included in the output buffer 100 is configured by five transistors, in the present invention, the configuration of the output buffer 100 is not limited thereto. In the present invention, it is not essential that the output buffer has both the pull-up circuit and the pull-down circuit, and the output buffer can be configured by only one of these circuits.

In the above embodiment, while the through rate of the output buffer 100 is adjusted, the present invention can be also applied to adjustment of an ODT characteristic at an ODT operation time.

While the present invention is most preferably applied to DRAMs, applications of the invention are not limited thereto. The present invention can be applied to all semiconductor devices capable of adjusting an impedance and a through rate of an output buffer.

What is claimed is:

1. A semiconductor device comprising:
a first terminal;
an output buffer electrically coupled to the first terminal;

a signal generator generating an impedance adjustment signal;
a through rate setting circuit generating a through setting signal irrespective of the impedance adjustment signal; and
a control circuit receiving impedance adjustment and the through rate setting signal, adjusting an impedance of the output buffer to one of first and second impedance in response to the impedance signal, adjusting a through rate, at which the output buffer drives the first terminal to one of first and second logic levels, to one of first and second through rates in response to the impedance adjustment signal and the through rate, setting signal,
wherein the control circuit operates first and second operations, the control circuit in the first operation sets the impedance to the first impedance which is greater than a designed impedance and sets the through rate to the first through rate which is less than a designed through rate, and the control circuit in the second operation sets the impedance to the second impedance which is less than the designed impedance and sets the through rate to the second through rate which is greater than the designed through rate.

2. The device as claimed in claim 1, further comprising:
a second terminal configured to be coupled to a resistor device,
wherein the signal generator is electrically coupled to the second terminal and generates the impedance adjustment signal in response to an impedance of the resistor device.

3. The semiconductor device as claimed in claim 1, wherein the through rate setting circuit includes a non-volatile memory element.

4. The semiconductor device as claimed in claim 1, wherein the through rate setting circuit includes at least one of a fuse element and an anti-fuse element.

5. A semiconductor device comprising:
a first terminal;
an output buffer electrically coupled to the first terminal;
a signal generator including a replica buffer which is indicative of a replica impedance, the replica impedance being substantially equal to an impedance of the output buffer, and the signal generator generating an impedance adjustment signal in response to the replica impedance; and
a control circuit receiving the impedance adjustment signal, adjusting the impedance of the output buffer to one of first and second impedance in response to the impedance adjustment signal and adjusting a through rate, at which the output buffer drives the first terminal to one of first and second logic levels, to one of first and second through rates in response to the impedance adjustment signal.

6. The device as claimed in claim 5, wherein the control circuit operates first and second operations, the control circuit in the first operation sets the impedance to the first impedance which is greater than a designed impedance and sets the through rate to the first through rate which is less than a designed through rate, and the control circuit in the second operation sets the impedance to the second impedance which is less than the designed impedance and sets the through rate to the second through rate which is greater than the designed through rate.

7. The device as claimed in claim 6, further comprising:
a second terminal configured to be coupled to a resistor device,
wherein the signal generator is electrically coupled to the second terminal and generates the impedance adjustment signal in response to an impedance of the resistor device.

8. The device as claimed in claim 6, further comprising:
a through rate setting circuit generating a through rate setting signal irrespective of the impedance adjustment signal,
wherein the control circuit, in each of the first and second operation modes, adjusts the through rate in response to the impedance adjusting signal and the through rate setting signal.

9. The device as claimed in claim 8, wherein the through rate setting circuit includes a non-volatile memory element.

10. The device as claimed in claim 8, wherein the through rate setting circuit includes at least one of a fuse element and an anti-fuse element.

11. A system comprising:
a semiconductor device including:
a first terminal;
an output buffer electrically coupled to the first terminal; and
a control circuit adjusting an impedance of the output buffer and a through rate at which the output buffer drives the first terminal to one of first and second logic levels; and
a controller device connected to the semiconductor device, the controller device including a measuring circuit coupled to the first terminal of the semiconductor device so as to measure an impedance of the output buffer of the semiconductor device,
wherein one of the semiconductor device and the controller device further includes a signal generator generating an impedance adjustment signal based on a result of measurement made by the measuring circuit of the controller device, and
wherein the control circuit of the semiconductor device adjusts the impedance to one of the first and second impedance in response to the impedance adjustment signal and adjusts the through rate to one of the first and second through rates in response to the impedance adjustment signal.

12. The system as claimed in claim 11, wherein the control circuit of the semiconductor device operates first and second operations, and the control circuit in the first operation sets the impedance to the first impedance which is greater than a designed impedance and sets the through rate to the first through rate which is less than a designed through rate, and the control circuit in the second operation sets the impedance to the second impedance which is less than the designed impedance and sets the through rate to the second through rate which is greater than the designed through rate.

* * * * *

UNITED STATES PATENT AND TRADEMARK OFFICE
CERTIFICATE OF CORRECTION

PATENT NO.        : 7,952,383 B2
APPLICATION NO.   : 12/461724
DATED             : May 31, 2011
INVENTOR(S)       : Masaru Kodato It is certified that error appears in the above-identified patent and that said Letters Patent is hereby corrected as shown below:

Title Page, Item (57) Abstract, line 3, and all other occurrences of "through-rate" in the Abstract, replace "through-rate" with "slew rate".
      Title Page, Item (57) Abstract, line 4, and all other occurrences of "through rate" in the Abstract, replace "through rate" with "slew rate".
      In Figure 1, and all other occurrences of "through-rate" in the Drawings, replace "through-rate" with "slew rate".
      In Figure 1, and all other occurrences of "through rate" in the Drawings, replace "through rate" with "slew rate".
      In column 1, line 12, and all other occurrences of "through rate" in the Specification, replace "through rate" with "slew rate".
      In column 1, line 26, and all other occurrences of "through rates" in the Specification, replace "through rates" with "slew rates".
      In column 1, line 66, and all other occurrences of "through-rate" in the Specification, replace "through-rate" with "slew rate".
      In column 15, line 3, and all other occurrences of "through rate" in the Claims, replace "through rate" with "slew rate".
      In column 15, line 12, and all other occurrences of "through rates" in the Claims, replace "through rates" with "slew rates".

Signed and Sealed this
Eighth Day of May, 2012

David J. Kappos
*Director of the United States Patent and Trademark Office*